Aug. 9, 1960 O. E. MATTIAT 2,948,867
PIEZOELECTRIC CERAMIC RESONATORS
Filed Nov. 17, 1958
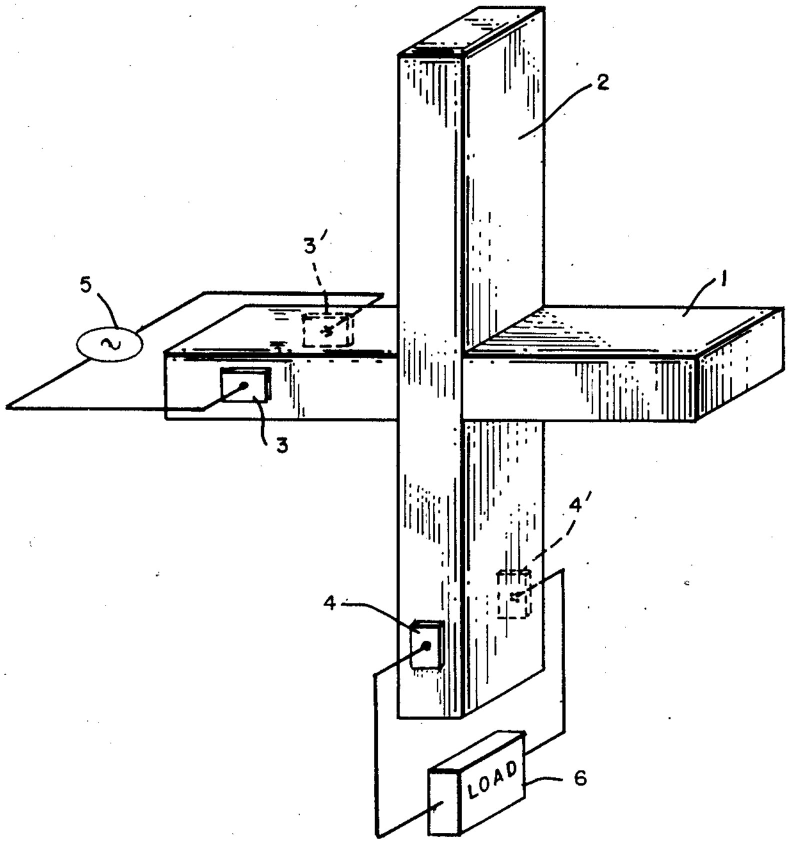
INVENTOR,
OSKAR E. MATTIAT
BY Harry M. Saragovitz
ATTORNEY.

United States Patent Office 2,948,867
Patented Aug. 9, 1960

2,948,867

PIEZOELECTRIC CERAMIC RESONATORS

Oskar E. Mattiat, Santa Barbara, Calif., assignor to the United States of America as represented by the Secretary of the Army Filed Nov. 17, 1958, Ser. No. 774,564

6 Claims. (Cl. 333—72)

This invention relates to electric wave filters, and more particularly to filters comprising piezoelectric ceramic crystals.

The invention relates more specifically to piezoelectric ceramic filters designed for use in radio broadcasting and receiving equipment.

Piezoelectric filters can be made to occupy a very small volume. They are particularly well suited for use in equipment calling for miniaturized components. Moreover, piezoelectric filters exhibit excellent band-pass characteristics.

In transistorized IF stages of radio equipment, piezoelectric filters can be used to replace the conventional IF transformers. For this application, it is very essential that the filter transformer pass only those frequencies which are within a relatively narrow band on either side of the center frequency, usually 455 kc.

When a piezoelectric element is electrically excited, it will set-up mechanical vibrations, as is well known in the field of piezoelectricity. The electrical excitation signal is often referred to as the "driving signal" or the "driving force," and the piezoelectric element is said to be "driven." Both expressions will be used in the description below.

Now, when a piezoelectric element is driven into fundamental resonance, other overtones are often as strong as the fundamental frequency; their presence greatly reduces the efficiency of the filter.

Accordingly, it is the main object of the present invention to provide a piezoelectric ceramic filter which eliminates, or at least greatly reduces, the transmission of the unwanted overtones.

The piezoelectric ceramic filter, in accordance with this invention, comprises two rod-shaped resonators intersecting each other at their respective geometrical centers. Each resonator has small cross sectional dimensions compared to its length. The resonators vibrate in an overtone of their length-wise resonance. The length length of one resonator is so dimensioned that it resonates at its first overtone; the length of the other is such that it vibrates at its second overtone. The first and the second overtones correspond to the same frequency.

The features of this invention which are believed to be novel are set forth with particularity in the appended claims. The present invention itself, both as to its organization and manner of operation, together with further objects and advantages thereof may best be understood from the following description and by reference to the accompanying drawing, the single figure of which is a schematic diagram showing one embodiment of a piezoelectric ceramic filter in accordance with this invention.

In the embodiment shown, the piezoelectric ceramic filter comprises two rod-shaped resonators 1 and 2, polarized for vibration in the longitudinal mode. The rods are of rectangular cross-section, and made of any suitable piezoelectric ceramic material such as barium titanate mixed with other titanates. Rods 1 and 2 intersect each other at their respective geometrical centers, as shown. Each rod has small cross-sectional dimensions compared to its length. Driving electrodes 3, 3' and the driven electrodes 4, 4' are made of conducting material and are deposited on the rods in any well known manner.

The length of rod 1 is such that it resonates in its first overtone of its longitudinal resonant frequency which is, for example, 455 kc.; the length of rod 2 is such that it resonates in its second overtone which is also 455 kc. In other words, 455 kc. is the vibrating frequency of both resonators and corresponds to the first overtone of rod 1 and to the second overtone of rod 2.

In operation, a radio-frequency voltage signal generator whose output frequency corresponds to the first overtone of resonator 1, is applied to electrodes 3, 3' as shown. The length of rod 1 is so dimensioned that it will vibrate predominately in its first overtone of its lengthwise mode of vibration, say 455 kc. The mechanical vibrations of resonator 1 will, in turn, excite rod 2 to resonate at the operating frequency of rod 1, i.e., also 455 kc. The vibrations of rod 2 induce a radio frequency voltage in electrodes 4, 4' having a frequency equal to the frequency of the vibrations. This voltage is applied to load 6, as shown.

In this composite resonator the fundamental resonant frequency of either rod will not be transmitted; also only the second overtone of resonator 2 will develop an output voltage in electrodes 4, 4'. This is due to the inherent construction of the composite resonator which makes rod 2 resonate only when an overtone of rod 1 has the same frequency as an overtone of rod 2. To illustrate with a numerical example, bar 1 has a fundamental, a first and a second overtone corresponding to 160, 455 and 680 kc., respectively; and bar 2 has a fundamental, a first and a second overtone corresponding to 105, 260, and 455 kc. respectively; the 160 and 680 kc. longitudinal vibrations of rod 1 will not induce any appreciable vibrations in rod 2, because no overtone of rod 2 has an overtone frequency corresponding to either 160 or 680 kc.; the 455 kc. longitudinal vibrations of rod 1 will be efficiently coupled to rod 2, since rod 2 has an overtone at 455 kc.

Thus, the main function of this composite resonator, which is to eliminate the transmission of unwanted fundamental, or overtones, as the case may be, contained in the applied signal, is accomplished in a simple and inexpensive manner. For most efficient operation electrodes 3, 3' and 4,4' should be located at a point of maximum vibrational stress. Also, additional output electrodes may be provided, if desired. Moreover, the amount of coupling between the rods can be varied by suitably reducing the coupling area between the rods. Although in the illustrated example only the first overtone frequency of rod 1 excites rod 2, it should be clearly understood that the fundamental or any higher overtone of rod 1 could be made to excite rod 2. All that is required is to make the frequency of an overtone of rod 1 equal to the frequency of an overtone of rod 2.

What is claimed is:

1. In a piezoelectric ceramic filter, two polarized rod-shaped resonators intersecting each other at their respective geometrical centers and vibrating in their lengthwise mode, one resonator being dimensioned to vibrate in its first overtone whereas the other is dimensioned to vibrate in its second overtone, the first and the second overtones corresponding to the same frequency.

2. The filter in accordance with claim 1, wherein the respective cross-sectional dimensions of the resonators are small compared to their length dimensions.

3. The filter in accordance with claim 2, wherein two input electrodes are arranged on one resonator and two output electrodes are arranged on the other resonator.

4. In combination, a piezoelectric ceramic filter comprising a first polarized rod-shaped resonator, a second polarized rod-shaped resonator, the two resonators intersecting each other at their respective geometrical centers, said first resonator being dimensioned for vibration in its first overtone, said second resonator being dimensioned for vibration in its second overtone, the first and the second overtones corresponding to the same frequency; two input electrodes disposed on said first resonator, two output electrodes disposed on said second resonator, means for applying a radio-frequency voltage signal to said input electrodes and means for extracting an output radio frequency voltage signal from said output electrodes.

5. The combination in accordance with claim 4, wherein the frequency of said applied voltage signal corresponds to the first overtone frequency of said first resonator.

6. The combination in accordance with claim 5, wherein the frequency of said output voltage signal corresponds to the second overtone of said second resonator.

References Cited in the file of this patent

UNITED STATES PATENTS

| | | |
|---|---|---|
| 2,262,966 | Rohde | Nov. 18, 1941 |
| 2,276,013 | Bohannon | Mar. 10, 1942 |
| 2,345,491 | Mason | Mar. 28, 1944 |
| 2,596,460 | Arenberg | May 13, 1952 |
| 2,738,467 | Roberts | Mar. 13, 1956 |

FOREIGN PATENTS

| | | |
|---|---|---|
| 892,282 | France | Nov. 2, 1943 |